United States Patent [19]
Nakashima et al.

[11] Patent Number: 5,566,129
[45] Date of Patent: Oct. 15, 1996

[54] SEMICONDUCTOR MEMORY DEVICE WITH ADDRESS TRANSITION DETECTOR

[75] Inventors: Katsuya Nakashima; Shumpei Kohri, both of Nagasaki; Akira Nakagawara, Kanagawa, all of Japan

[73] Assignee: Sony Corporation, Tokyo, Japan

[21] Appl. No.: 24,272

[22] Filed: Feb. 26, 1993

[30] Foreign Application Priority Data

Feb. 28, 1992 [JP] Japan ................................. 4-044090
Feb. 28, 1992 [JP] Japan ................................. 4-044093

[51] Int. Cl.$^6$ ................................................. G11C 8/00
[52] U.S. Cl. ........................ 365/233.5; 327/10; 327/16; 327/36; 327/174; 327/217
[58] Field of Search ................... 365/233.5; 307/231, 307/234, 510, 529; 327/10, 16, 36, 71, 153, 174, 217, 172, 175, 298, 77, 78, 291, 198

[56] References Cited

U.S. PATENT DOCUMENTS 5,059,818  10/1991  Witt et al. ............................ 327/217
5,233,232  8/1993   Steubing et al. ..................... 307/234
5,255,130  10/1993  Buchan et al. ...................... 327/172

FOREIGN PATENT DOCUMENTS 0155787  9/1985  European Pat. Off. .
0322901  7/1989  European Pat. Off. .

*Primary Examiner*—David C. Nelms
*Assistant Examiner*—F. Niranjan
*Attorney, Agent, or Firm*—Hill, Steadman & Simpson

[57] ABSTRACT

A semiconductor memory device with an address transition detector comprises a flip-flop circuit (FF) having set and reset input terminals and a delay circuit (3). A pulse signal is input to a set input terminal (S) of the flip-flop circuit (FF) and an output signal (P) of the flip-flop circuit (FF) is input through the delay circuit (3) to a reset terminal (R) of the flip-flop circuit (FF), whereby a constant width signal which is independent of a waveform of an address signal and which responds only to the change of address can be obtained as an address transition signal of a SRAM (static random access memory). An internal circuit of the SRAM is initialized by the constant width signal, thereby preventing a malfunction caused by the fact that an initialization time depends on the waveform of the address signal.

6 Claims, 15 Drawing Sheets

SEMICONDUCTOR MEMORY DEVICE WITH ADDRESS TRANSITION DETECTOR

BACKGROUND OF THE INVENTION

1. Field of the Invention

The present invention relates to a semiconductor memory device having an address transition detector in which a transition point of a plurality of row addresses or column addresses is detected to generate an internal initialization signal to thereby increase an operation speed of a SRAM (static random access memory), for example. More particularly, this invention relates to a circuit technology for enabling the SRAM to operate at high speed by using a pulse generating circuit capable of varying a pulse width of the internal initialization signal with ease and which can generate a pulse of a constant pulse width, a pulse width enlarging circuit capable of enlarging a pulse width to a desired pulse width and a pulse width sum generating circuit for calculating output signals of a plurality of pulse generating circuits or a plurality of pulse sum generating circuits in an OR fashion.

2. Description of the Prior Art

So far there is known a technology that can reduce an access time of SRAM, for example, by using an ATD (address transition detector).

As shown in FIG. 1 of the accompanying drawings, the ATD circuit includes a plurality of input terminals $\phi_1, \phi_2, \ldots, \phi_n$ to which row addresses, for example, are input and exclusive-OR circuits $XOR_1, XOR_2, \ldots, XOR_n$ connected correspondingly to the input terminals $\phi_1, \phi_2, \ldots, \phi_n$. The exclusive-OR circuits $XOR_1, XOR_2, \ldots, XOR_n$ are respectively supplied with delay address signals $S_{Sa1}, S_{Sa2}, \ldots, S_{San}$ from the corresponding input terminals $\phi_1, \phi_2, \ldots, \phi_n$ and delay address signals $dS_{a1}, dS_{a2}, \ldots, d_{San}$ which result from processing the address signals $S_{a1}, S_{a2}, \ldots, S_{an}$ by inverter columns of multiple stages (inverters of four stages are connected in the illustrated example), respectively. The respective exclusive-OR circuits $XOR_1, XOR_2, \ldots XOR_n$ output reference pulse signals $P_{a1}, P_{a2}, \ldots, P_{an}$ of address detection signals which will be described later on. Operation of the ATD circuit will be described with reference to a timing chart forming FIG. 2. When the address signal $S_{a1}$ is changed at timing point $t_1$, the pulse signal $P_{a1}$ from the ATD circuit rises at timing point $t_1$. At timing point $t_2$ after a delay time $T_1$ of the inverter column was passed, the pulse signal $P_{a1}$ falls in response to the delay address signal $dS_{a1}$ and becomes a pulse signal having a predetermined width $T_1$.

A memory having the above ATD circuit and the peripheral circuit will be described with reference to FIG. 3.

In FIG. 3, reference numeral 101 depicts a general-purpose row decoder, 102 a general purpose column decoder, 103 and 104 a bit line and an inverting bit line, 105 to 105 memory cells, 108 and 109 column decoder coupling transistors, 110 a bit line equalization circuit, 112 an equalization logic circuit, 113 a row address transition detection (ATD) and control circuit (hereinafter simply referred to as a row ATD· control circuit), 114 a column address transition detection (ATD) and control circuit (hereinafter simply referred to as a column ATD·control circuit), 116 and 117 data lines and 118 . . . , 118 word lines.

The bit line equalization circuit 110 includes two N-channel transistors 122, 123 and one P-channel transistor 124. The data line equalization circuit 111 includes two N-channel transistors 126, 127 and one P-channel transistor 128. The equalization logic circuit 112 includes four inverters 131 to 134, two N-channel transistors 136, 137 and one P-channel transistor 138.

Each of the memory cells 105 . . . 105 is a conventional SRAM where input thereof are respectively connected to the word lines 118 . . . 118 and complementary outputs are respectively connected to the bit line 103 and the inverting bit line 104, respectively.

Of the decoder coupling transistors 108 and 109, a gate of the transistor 108 is connected to the output of the column decoder 102, one electrode of the source and drain electrodes thereof is connected to the bit line 103 and the other electrode thereof is connected to the data line 116. A gate of the other column decoder coupling transistor 109 is connected to the output of the column decoder 102, one electrode of the source and drain electrodes thereof is connected to the inverting bit line 104 and the other electrode is connected to the data line 117.

Of the two transistors 122 and 123 constructing the bit line equalization circuit 110, a drain electrode of the transistor 122 is connected to the positive voltage source terminal Vcc, a precharge signal Sp generated by the equalization logic circuit 112 is applied to the gate thereof and a source electrode thereof is connected to the bit line 103. A drain electrode of the other N-channel transistor 123 is connected to the positive voltage source terminal Vcc, the precharge signal Sp generated by the equalization logic circuit 112 is applied to a gate thereof and a source electrode thereof is connected to the inverting bit line 104.

One electrode of the source and drain electrodes of the P-channel transistor 124 constructing the bit line equalization circuit 110 together with the above two N-channel transistors 122, 123 is connected to the bit line 103, the other electrode is connected to the inverting bit line 104 and an equalization signal *Sp generated by the equalization logic circuit 112 is applied to a gate thereof.

Of the two N-channel transistors 126 and 127 constructing the data line equalization circuit 111, a drain electrode of the transistor 126 is connected to the positive voltage source terminal Vcc, a source electrode thereof is connected to the data line 116 and the precharge signal Sp from the equalization logic circuit 112 is applied to a gate thereof. A drain electrode of the other N-channel transistor 127 is connected to the positive voltage source terminal Vcc, a source electrode thereof is connected to the data line 117 and the precharge signal Sp from the equalization logic circuit 112 is applied to a gate thereof.

In the P-channel transistor 128 that constructs the data line equalization circuit 11 together with the two N-channel transistors 126, 127, one electrode thereof is connected the data line 116, the other electrode thereof is connected to the data line 117, and the inverted precharge signal *Sp from the equalization logic circuit 112 is applied to a gate thereof.

Of the four inverters 131 to 134 constructing the equalization logic circuit 112, the first inverter 131 is supplied with a row address transition detection signal (hereinafter simply referred to as a row ATD signal) *RX generated from the row ATD·control circuit 113 and outputs an inverted signal RX. The second inverter 132 connects its input to the output of the first inverter 131 and outputs an equalization signal *SEq.

Transistors constructing the equalization logic circuit 112 will be described below. A source electrode of the first N-channel transistor 136 is grounded, a gate electrode thereof is connected to the output of the inverter and a drain electrode thereof is connected to an input line 139 of the third inverter 133. A gate of the second N-channel transistor 137 is supplied with the equalization signal *Seq from the inverter 132, one of the source and drain electrodes thereof is connected to the input line 139 and the other electrode is connected so as to receive a column address transition detection signal (hereinafter simply referred to as a column ATD signal) *CX generated from the column ATD·control circuit 114.

A gate of the P-channel transistor 138 is connected to the gate of the N-channel transistor 136, one of the source and drain electrodes is connected to the input line 139 of the inverter 133 and the other electrode is supplied with the column ATD signal *CX from the column ATD·control circuit 114.

An input of the third inverter 133 is connected to the input line 139 and outputs the precharge signal Sp. An input of the fourth inverter 134 is connected to the output of the inverter 133 and outputs the inverted signal *Sp of the precharge signal Sp.

The row ATD·control circuit 113 detects the change of an arbitrary row address signal of the row address signals supplied from the row address bus 141. At that time, when the circuit 113 detects no address skew, the circuit 113 outputs a pulse (row ATD signal) *RX of negative polarity having a signal width of 5 to 6 nsec, for example. When there is an address skew, the signal width of the ATD signal is extended more. The row ATD·control circuit 113 outputs an enable signal RD to the row decoder 101. The enable signal RD of logic "0" represents the disabled state and the enable signal RD of logic "1" represents the enabled state. The row decoder 101 is controlled by the enable signal RD.

In a similar manner, the column ATD·control circuit 114 detects the change of the column address signal supplied from the column address bus 142 and outputs a pulse of negative polarity (column ATD signal). Also, the circuit 114 controls the column decoder 102 by an enable signal CD.

When being enabled, the row decoder 101 selects one word line from the word lines 118 . . . 118 determined by the row decoder 101. Similarly, when enabled, the column decoder 102 selects transistors determined by the column decoder 102, e.g., transistors 108 and 109 in the illustrated example.

During the equalization operation (when the row ATD signal is at logic "0"), the enable signal RD goes to logic "0" to set the row decoder 102 in all non-selection state. The reason for this is as follows. When the enable signal RD, for example, goes to logic "1" and any one of the word lines 118 is selected, an unnecessary current is flowed to the memory cell 105 selected by the word line 118 during the equalization period. Accordingly, the enable signal RD is set to logic "0" so the above-mentioned disadvantage can be avoided.

Further, in the transition of the column address (column ATD signal is at logic "0"), it is frequently observed that, when the row address is not changed, the bit lines 103 and the inverting bit line 104 connected to the data lines 116 and 117 are replaced. Consequently, the potentials of the bit line 103 and the inverting bit line 104 are inverted. There is then the risk that a bad influence will be exerted upon the data read-out speed. Accordingly, the enable signal CD is held at logic "0" until the equalization operation of the data lines 116, 117 is ended to thereby set the column decoder 102 in the all non-selection state.

As described above, in the address transition, the ATD signals (pulse signals) *RX and *CX are generated, the bit line 103 and the inverting bit line 104 are equalized, the potentials of the complementary bit line 103 and inverting bit line 104 are made the same and then the memory cells 105 . . . 105 are activated, thereby increasing the read-out speed of the memory.

However, as shown in FIG. 2, when a pulse-shaped signal having a pulse width $\Delta t$ shorter than the delay time $T_1$ is supplied as the address signal $S_{a1}$, for example, at timing point$_2$, two pulse signals having a pulse width $\Delta t$ are successively produced at an interval of the delay time $T_1$.

That is, there are produced a pulse signal which rises at timing point $t_2$ and falls at timing point $t_3$ and a pulse signal which rises at timing point $t_4$ ($=t_2+t_1$) and falls at timing point $t_5$ ($=t_4+\Delta t$). When the internal circuit of the SRAM is initialized by using these pulse signals, the initialization cannot be carried out with sufficient time and in worst cases, a malfunction occurs.

OBJECTS AND SUMMARY OF THE INVENTION

Accordingly, it is an object of the present invention to provide a pulse generating circuit in which, when an internal circuit of a SRAM is initialized by using an ATD signal, there can be obtained a pulse signal having a constant pulse width independent of a waveform of an address signal and which becomes a reference ATD signal responsive only to the change of address.

It is another object of the present invention to provide a pulse width enlarging circuit which can obtain a pulse signal (signal which becomes a reference of ATD signal) having a pulse width so that an initialization can be carried out with sufficient time when an internal circuit of the SRAM, for example, is initialized by using the ATD signal.

It is a further object of the present invention to provide a pulse sum generating circuit which can obtain an ATD signal having a constant width responsive at least to one address signal of a plurality of address signals when a plurality of addresses are changed.

A pulse generating circuit A of the present invention comprises a flip-flop A and a delay circuit 3. The flip-flop circuit A includes a first input terminal S to which a control signal for setting an output signal P to a first logic value is input, a second input terminal R to which a control signal for setting the output signal P to a second logic value is input, and an output terminal Q from the output signal P is output. A trigger pulse signal Pa is input to the first input terminal S and a delay signal dP which results from delaying the output signal P of the flip-flop circuit FF by the delay circuit 3 is input to the second input terminal R.

A pulse width enlarging circuit C of the present invention comprises means 12 having a plurality of input terminals and calculating a sum of input signals supplied to the respective input terminals and the pulse generating circuit A. The output signal P of the pulse generating circuit A and at least a delay signal of one output signal P are input to the input terminals of the means 12.

A pulse sum generating circuit D of the present invention comprises means 12 having a plurality of input terminals and calculating a sum of input signals supplied to the respective input terminals and a plurality of pulse generating circuits $A_1, A_2, A_3, \ldots A_n \ldots$ Output signals $P_1, P_2, P_3, \ldots P_n$ of the respective pulse generating circuits $A_1, A_2, A_3, \ldots A_n$ are input to the input terminals of the means 12 which calculates a sum of input signals.

A pulse sum generating circuit E of the present invention comprises means 21 having a plurality of input terminals and calculating a sum of input signals supplied to the respective input terminals and a plurality of pulse width enlarging circuits $C_1, C_2, C_3, \ldots C_n$. Output signals $P_{c1}, P_{c2}, P_{c3}, \ldots P_{cn}$ of the respective pulse width enlarging circuits $C_1, C_2, C_3, \ldots C_n$ are input to the input terminals of the means 21 which calculates a sum of input signals.

According to the pulse generating circuit A of the present invention, the pulse signal Pa which becomes a reference of the ATD signal is input to the first input terminal S and the signal dP which results from delaying the output signal P of the flip-flop circuit FF is input to the second input terminal R, whereby the output signal P of the flip-flop FF is inverted by the pulse signal Pa generated when the address is changed. After the constant delay time $T_2$ determined by the delay circuit 3, the output signal P of the flip-flop circuit FF is inverted again. This pulse generating circuit A responds to the first change of the address signal Sa but does not respond to the address signal Sa which is changed again within the constant delay time $T_2$. Therefore, this pulse generating circuit A output the pulse signal (signal which becomes a reference of ATD signal) P having a constant pulse width that responds to the first change of the address signal Sa.

According to the pulse width enlarging circuit C of the present invention, since the output signal P of the pulse generating circuit A and the delayed signal of at least one output signal P are input to the input terminal of the means 12 which calculates a sum of input signals, a pulse width $T_2$ of the pulse signal P having the constant width from the pulse generating circuit A can be enlarged with ease. Accordingly, this pulse width enlarging circuit C becomes effective when the pulse signal P having the constant width from the pulse generating circuit A does not have a pulse width sufficient so that the internal circuit of the SRAM, for example, can be initialized.

According to the pulse sum generating circuit D of the present invention, since the output signals $P_1, P_2, P_3, \ldots P_n$ from a plurality of pulse generating circuits $A_1, A_2, A_3, \ldots A_n$ are respectively input to the input terminals of the means 12 which calculates a sum of input signals. If the pulse generating circuits A corresponding to the addresses in number are prepare to obtain a plurality of pulse signals $P_1, P_2, P_3, \ldots P_n$ and the respective pulse signals $P_1, P_2, P_3, \ldots P_n$ are input to the means 12 which calculates a sum of input signals, the means 12 can produce the ATD signal that is used to initialize the internal circuit of the SRAM, for example, in response to the change of at least one address. That is, when a plurality of addresses are changed, there can be obtained the ATD signal having the constant width in response to one address signal of a plurality of address signals $S_{a1}, S_{a2}, S_{a3}, \ldots S_{an}$.

According to the pulse sum generating circuit E of the present invention, since the output signals $P_{c1}, P_{c2}, P_{c3}, \ldots P_c$ from a plurality of pulse width enlarging circuits $C_1, C_2, C_3, \ldots C_n$ are respectively input to the input terminals of the means 21 which calculates a sum of input signals, in response to the change of at least one address signal of a plurality of address signals $S_{a1}, S_{a2}, S_{a3}, \ldots S_{an}$, the OR 21 can produce an arbitrary pulse signal (ATD signal) Pe sufficient so that the internal circuit of the SRAM, for example, can be initialized.

As described above, according to the pulse generating circuit A, the pulse width enlarging circuit C, and the pulse sum generating circuits D and E of the present invention, even when the pulse signal having a pulse width insufficient so that the internal circuit of the SRAM, for example, cannot be initialized is input as the address signal, there can be obtained the ATD signal (i.e., signal which becomes a reference for initializing the internal circuit) having the necessary pulse width. Therefore, even when the address signal is changed in a short cycle or even when a noise is input to the address input terminal, the internal circuit can be initialized with enough time. Thus, a fluctuation of access time due to the waveform of the address signal can be removed and also, the operation speed of the SRAM can be increased.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Embodiments of the present invention will hereinafter be described with reference to FIGS. 4 to 18.

Figure 4:
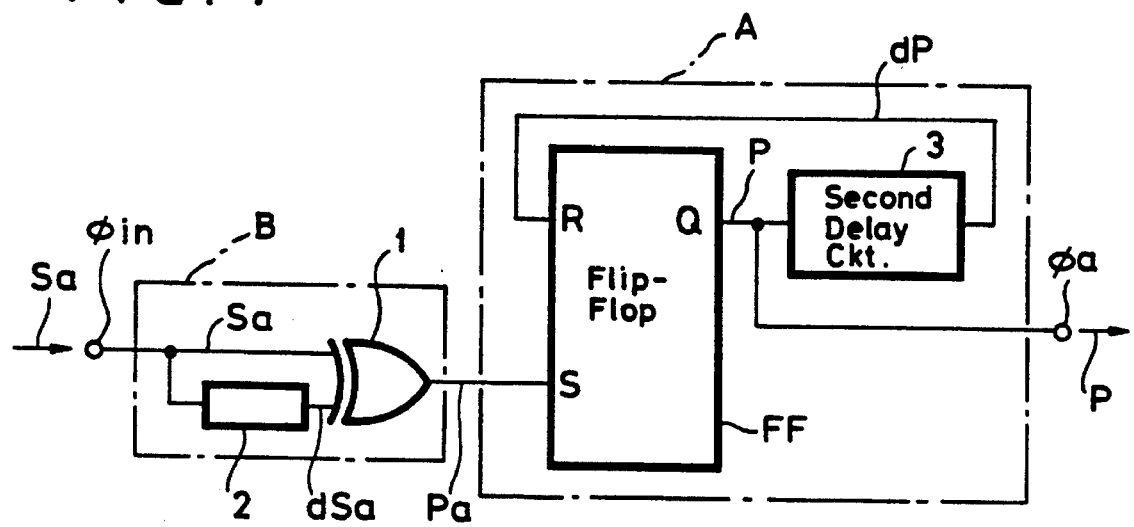
FIG. 4 is a block diagram showing a pulse generating circuit according to a first embodiment of the present invention.

FIG. 4 is a block diagram showing a pulse generating circuit A according to a first embodiment of the present invention.

This pulse generating circuit A is connected to the rear stage of the conventional address transition detecting circuit (hereinafter simply referred to as an ATD circuit) B. A circuit arrangement of the ATD circuit B will be described. The ATD circuit B comprises a 2-input exclusive-OR circuit 1 and a first delay circuit 2 having a delay time $T_1$. One address signal Sa from the address bus is input to one input terminal of the exclusive-OR circuit 1 and a delay signal dSa which results #rom delaying the address signal Sa by the first delay circuit 2 is input to the other input terminal thereof.

The pulse generating circuit A according to this embodiment comprises a flip-flop circuit having set and reset input terminals (hereinafter simply referred to as a flip-flop circuit) FF and a second delay circuit 3. An output terminal of the ATD circuit B is connected to the set input terminal of the flip-flop circuit FF and the output signal P of the flip-flop circuit FF is input to the second delay circuit 3 having a delay time $T_2$. A delay signal dP from the second delay circuit 3 is supplied to the reset terminal R of the flip-flop circuit FF. An output terminal Q of the flip-flop circuit FF is led out through a contact as an output terminal φa of the pulse generating circuit A.

In the pulse generating circuit A thus arranged, the output signal P of the flip-flop circuit FF is automatically reset to [0]. That is, if the output signal P is at logic [1], then the signal of logic [1] is transmitted through the second delay circuit 3 to the reset input terminal R of the flip-flop circuit FF so that the output P is reset to [0]. Accordingly, it should be noted that the pulse generating circuit A is the circuit that is reset to [0] with the delay time $T_2$ of the second delay circuit 3 after the output signal P rose.

Figure 5:
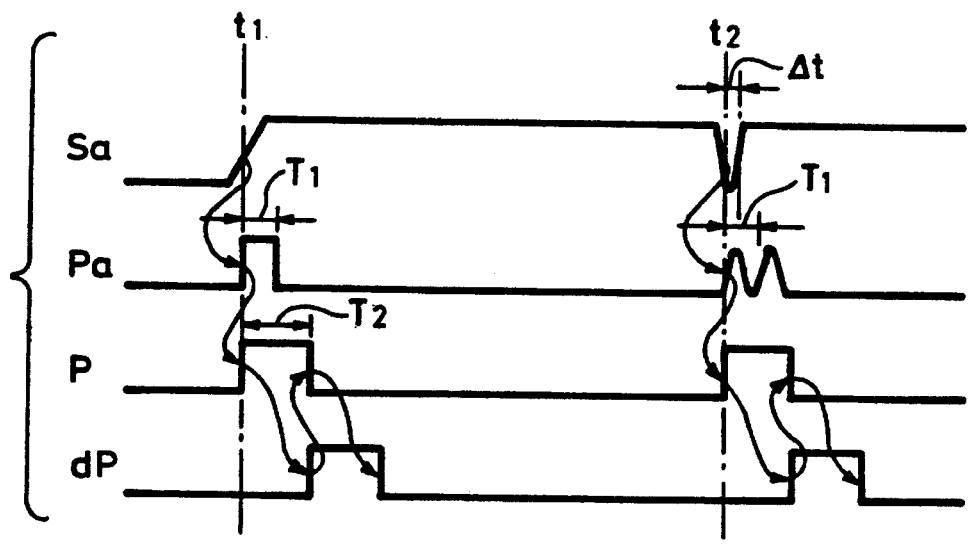
FIG. 5 is a timing chart showing an operation of the pulse generating circuit according to the first embodiment of the present invention.

Operation of the pulse generating circuit A according to the first embodiment of the present invention will be described with reference to a timing chart of FIG. 5.

Figure 1:
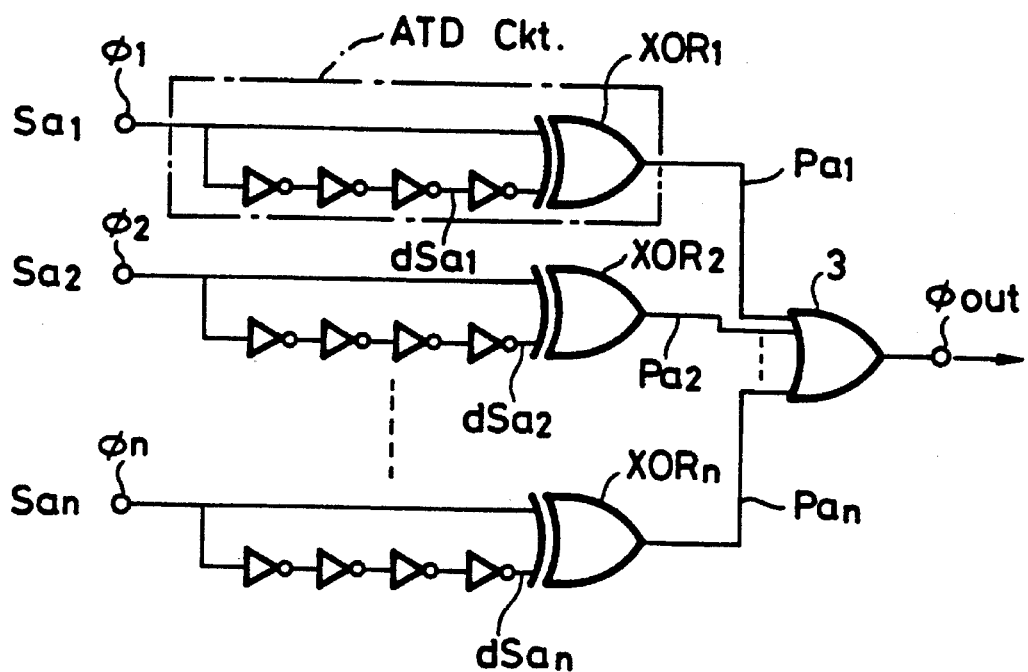
FIG. 1 is a circuit diagram showing an example of a conventional ATD circuit.
Figure 2:
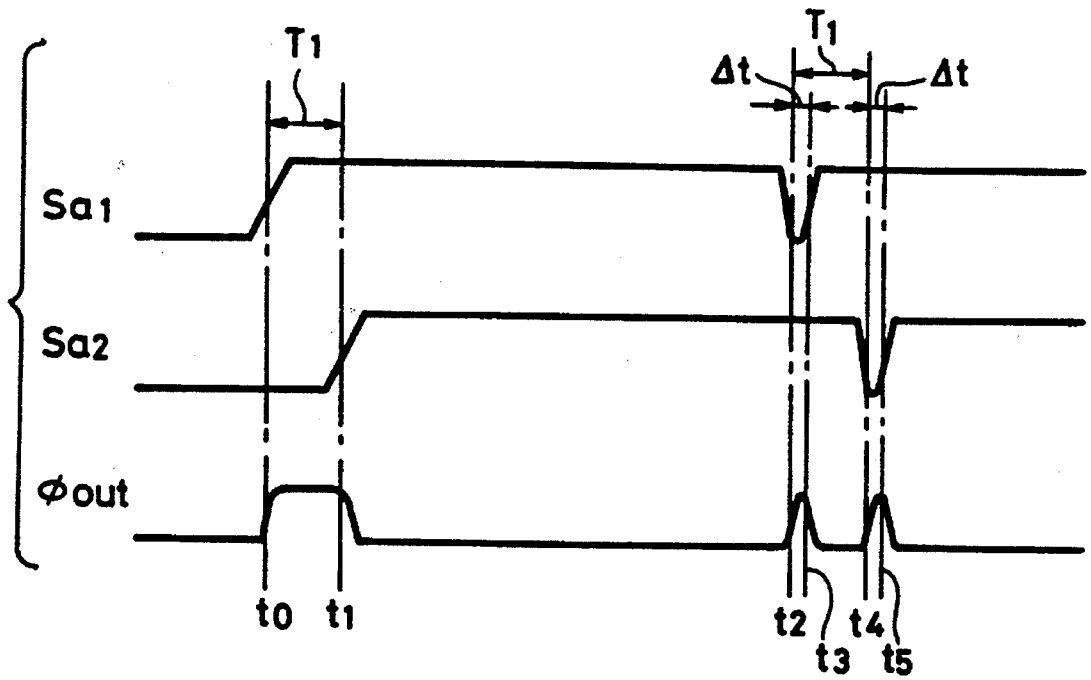
FIG. 2 is a timing chart showing an operation of the conventional ATD circuit.

When the address signal Sa supplied to the input terminal φin of the ATD circuit B is changed at timing point $t_1$, from the similar reason that was described on the operation of the conventional example with reference to FIGS. 1 and 2, the pulse signal of positive polarity having a pulse width $T_1$ (signal that becomes a reference of the ATD signal) Pa is output and is also input to the set input terminal S of the flip-flop circuit FF.

As described above, the pulse signal Pa is input to the set input terminal S of the flip-flop circuit FF, whereby the output signal P of the flip-flop circuit FF is inverted to logic [1].

The output signal of the flip-flop circuit FF is delayed by the delay time $T_2$ of the second delay circuit 3 and then supplied to the reset input terminal R of the flip-flop circuit FF so that the output signal P of the flip-flop circuit FF is inverted to logic [0]. Thus, the pulse signal Pa having the constant pulse width $t_2$ is output from the output terminal φa of the pulse generating circuit A.

When a pulse-shaped signal having a pulse width at shorter than the delay time $T_1$ of the first delay circuit 2 is supplied to the input terminal φin of the ATD circuit B, two pulse signals having the pulse width Δt is continuously output from the output terminal of the ATD circuit B at time interval of $T_1$ and the same time, the two continuous pulse signals are input to the set input terminal S of the flip-flop circuit FF.

At that time, although the output signal P is inverted to logic [1] in response to the first pulse signal, such output signal does not respond to the second pulse. The reason for this that a relationship between the delay time $T_1$ of the first delay circuit 2 and the delay time $T_2$ of the second delay circuit 3 is set as $T_2 > T_1$. Therefore, even though the potential at the set input terminal S is changed within the delay time $T_2$, the change of potential is not reflected on the output signal P.

The output signal P from the output terminal Q of the flip-flop circuit FF is delayed by the delay time $T_2$ of the second delay circuit 3 and input to the reset input terminal R of the flip-flop circuit FF so that the output signal P of the flip-flop circuit FF is inverted to logic [0]. Thus, similarly in the case of the timing point $t_1$, the pulse signal P having the constant pulse width $T_2$ is output from the output terminal φa of the pulse generating circuit A.

As described above, according to the pulse generating circuit A of the first embodiment, since the pulse signal (signal which becomes a reference to the ATD signal) from the ATD circuit B is input to the set input terminal S and the output signal dP which results from delaying the output signal P of the flip-flop circuit FF by the second delay circuit 3 is input to the reset input terminal R, the output signal P from the flip-flop circuit FF is inverted at the leading edge of the first address signal Sa generated in the change of address. Subsequently, after the constant delay time $T_2$ determined by the second delay circuit 3, the output signal of the flip-flop circuit FF is inverted again.

That is, although the pulse generating circuit A responds to the first change of the address signal Sa, it does not respond to the address signal Sa that changes again within the constant delay time $T_2$. Accordingly, the pulse generating circuit A outputs the pulse signal P (signal which becomes a reference to the ATD signal) having the constant pulse width $T_2$ responsive only to the first change of the address signal Sa.

Figure 6:
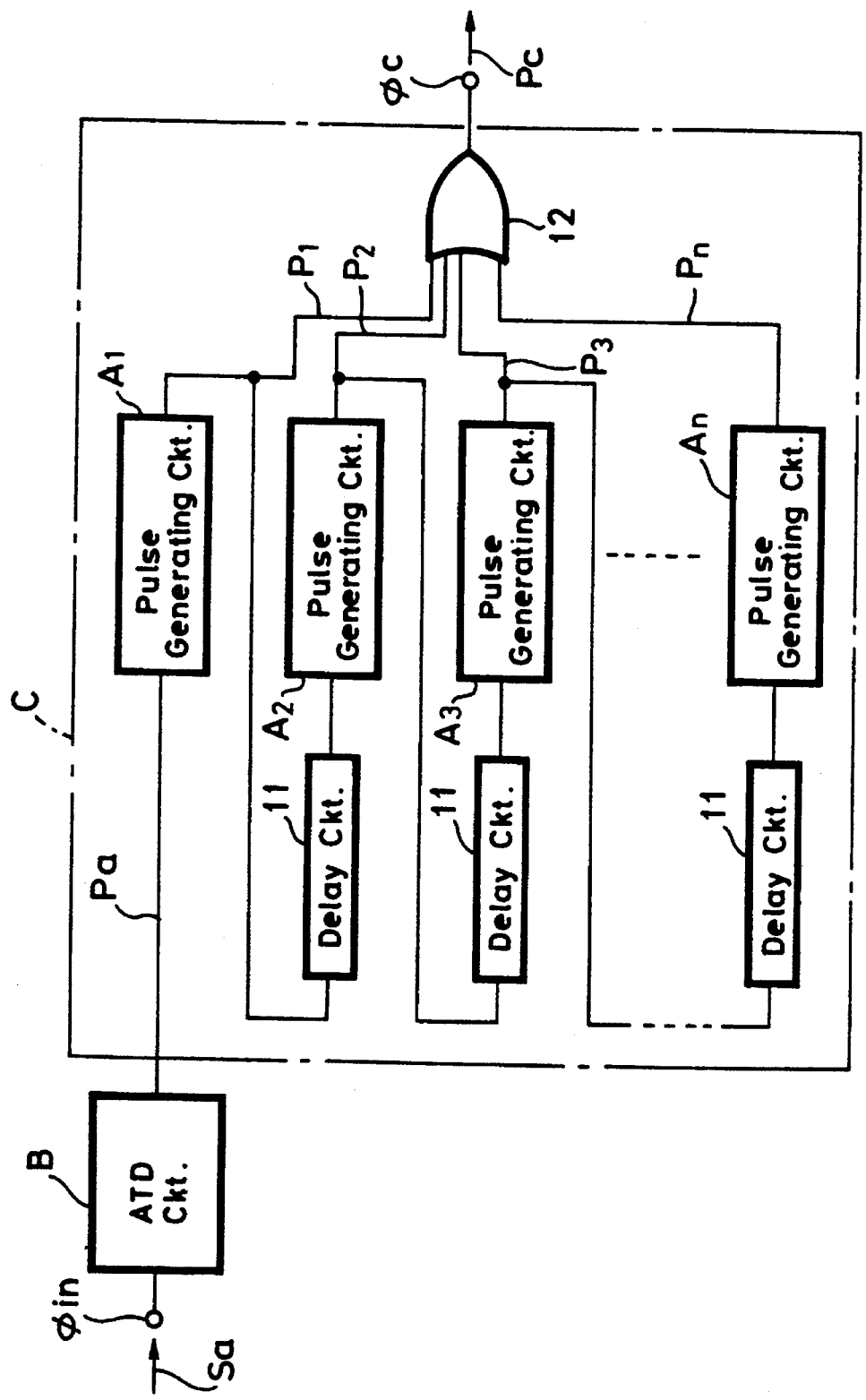
FIG. 6 is a block diagram showing a pulse width enlarging circuit according to a second embodiment of the present invention.
Figure 7:
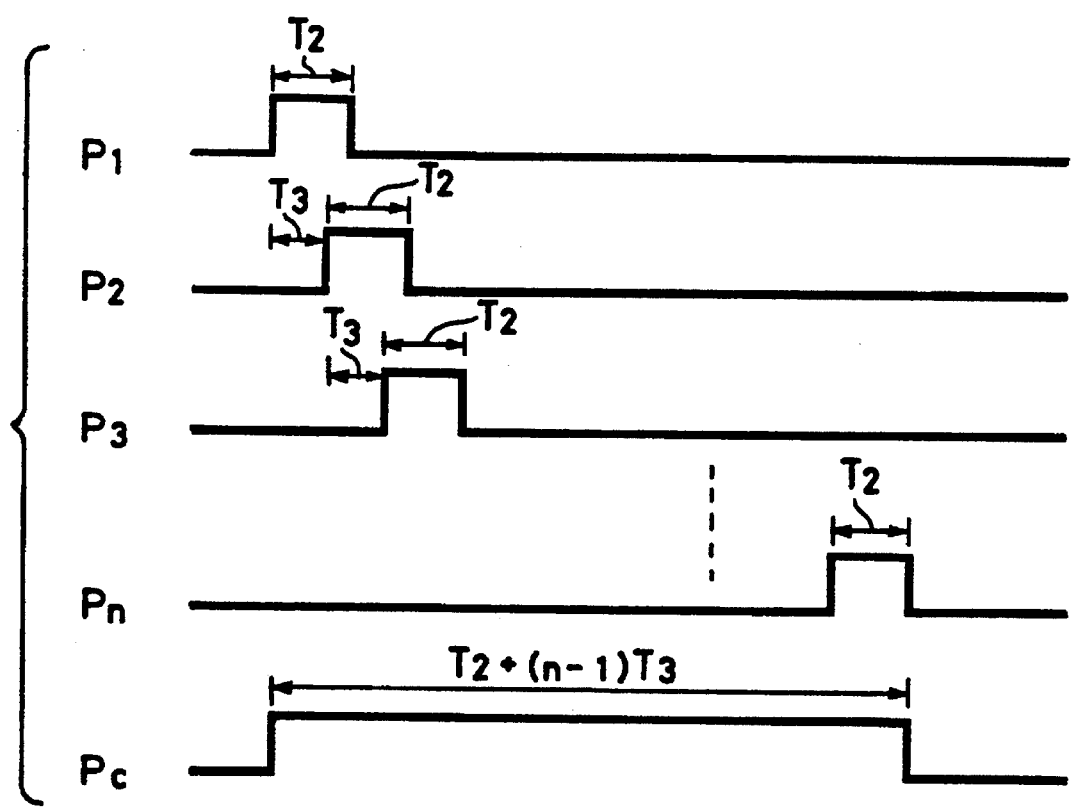
FIG. 7 is a timing chart showing an operation of the pulse width enlarging circuit according to the second embodiment of the present invention.

A pulse width enlarging circuit C according to a second embodiment of the present invention will be described with reference to FIGS. 6 and 7. In FIGS. 6 and 7, like parts corresponding to those of FIG. 4 are marked with the same references.

As shown in FIG. 6, the pulse width enlarging circuit C comprises a plurality of pulse generating circuits $A_1, A_2, A_3,$ ... $A_n$ shown in FIG. 4 connected in series across a third delay circuit 11 and an OR circuit 12 connected with output terminals of these pulse generating circuits $A_1, A_2, A_3,$ ...

$A_n$. A delay time $T_3$ of the third delay circuit 11 is set as $T_3 > T_2$. The conventional ATD circuit B (see FIG. 1) is connected to the preceding stage of the pulse generating circuit $A_1$ of the first stage.

Operation of the pulse width enlarging circuit C will be described with reference to a timing chart of FIG. 7. As shown in FIG. 7, when the address signal Sa supplied to the input terminal φin of the ATD circuit B is changed, simultaneously, a pulse signal $P_1$ having a pulse width $T_2$ is output from the pulse generating circuit $A_1$ of the first stage. At that time, the pulse signal $P_1$ is input to the OR circuit 12 and an output signal Pc from the output terminal φc of the OR circuit 12 is inverted to high level, for example.

The pulse signal $P_1$ from the pulse generating circuit $A_1$ of the first stage is delayed by the delay time $T_3$ of the third delay circuit 11 and input to the pulse generating circuit $A_2$ of the second stage. Therefore, the pulse generating circuit $A_1$ outputs a pulse signal $P_2$ which rises at timing delayed with time $T_3$ from the leading edge of the first pulse signal $P_1$ and which has a pulse width $T_2$. In this case, since the delay time $T_3$ is set to be shorter than the pulse width $T_2$, the first pulse signal $P_1$ and the second pulse signal $P_2$ partly overlap with each other from a time standpoint. Accordingly, the output signal Pc from the OR circuit 12 is still held at high level.

Similarly, pulse signals $P_3 \ldots P_n$ are sequentially output with the delay time $t_3$ from the pulse generating circuit $A_3$ to the pulse generating circuit $A_n$ of n stage (final stage). Then, when no output is output from the pulse generating circuit $A_n$ of the final stage, the output signal Pc of the OR circuit 12 is inverted and becomes low level. Accordingly, a pulse signal Pc which rises at the leading edge of the pulse signal $P_1$ from the pulse generating circuit $A_1$ of the first stage, i.e., which rises simultaneously at the leading edge of the ATD signal Pa from the ATD circuit B and which has a pulse width $T_2 + (n-1)T_3$ can be obtained from the output terminal φc of the OR circuit 12.

According to the pulse width enlarging circuit C of the present invention, since the pulse signal P from the pulse generating circuit A and the signals which results from sequentially delaying the output signal P are input to the OR circuit 12, the pulse width of the pulse signal P having the constant width from the pulse generating circuit A can be enlarged with ease. Therefore, the pulse width enlarging circuit C becomes effective when the pulse signal P having the constant width from the pulse generating circuit A does not have pulse width sufficient so that the internal circuit of the SRAM, for example, cannot be initialized.

In the second embodiment of the present invention, if the pulse generating circuits $A_2, A_3, \ldots A_n$ of the second stage and the following stages are omitted, the same results can be obtained. In this case, the circuit arrangement can be effectively avoided from becoming complex.

Figure 8:
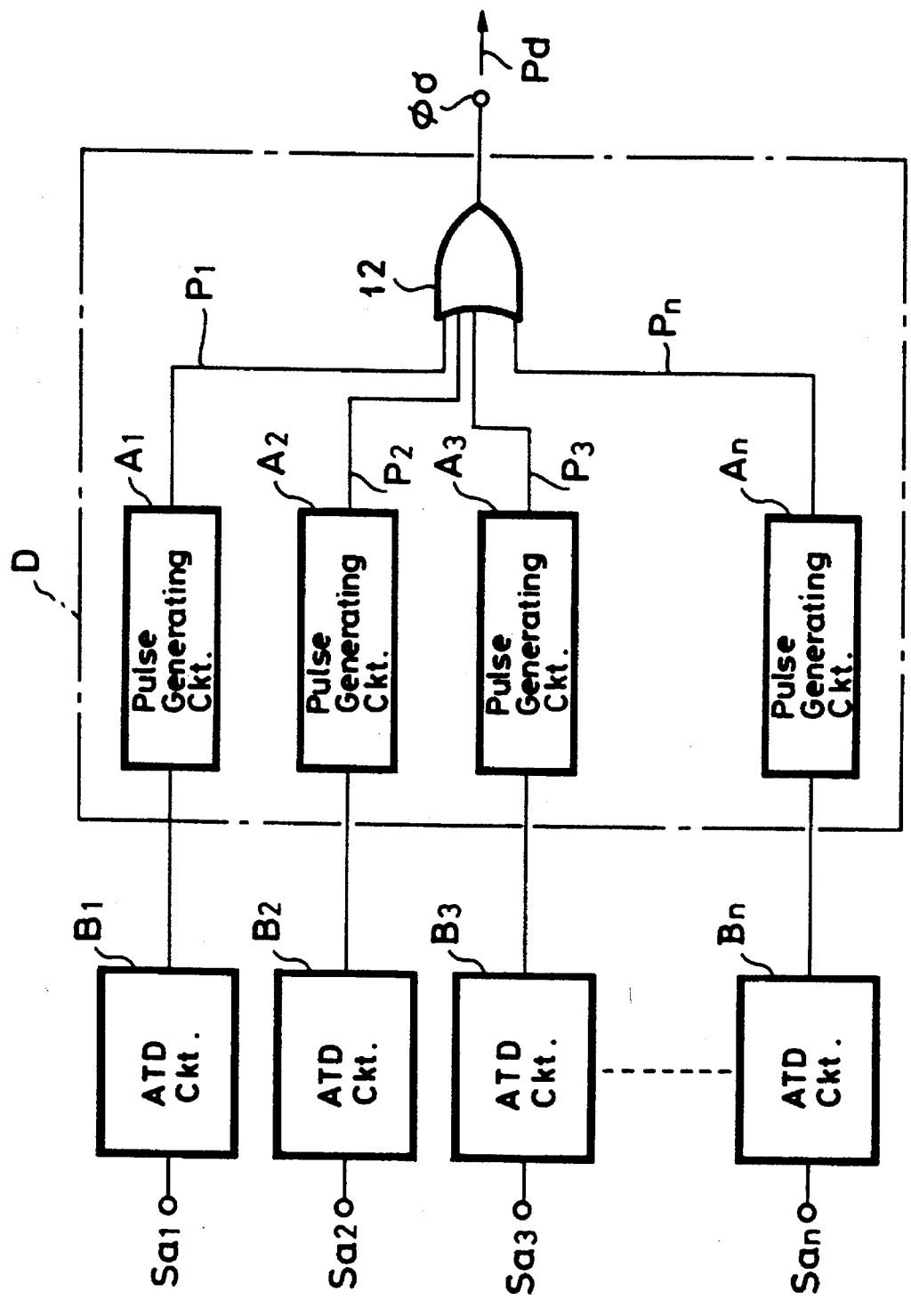
FIG. 8 is a block diagram showing a pulse sum generating circuit according to a third embodiment of the present invention.
Figure 9:
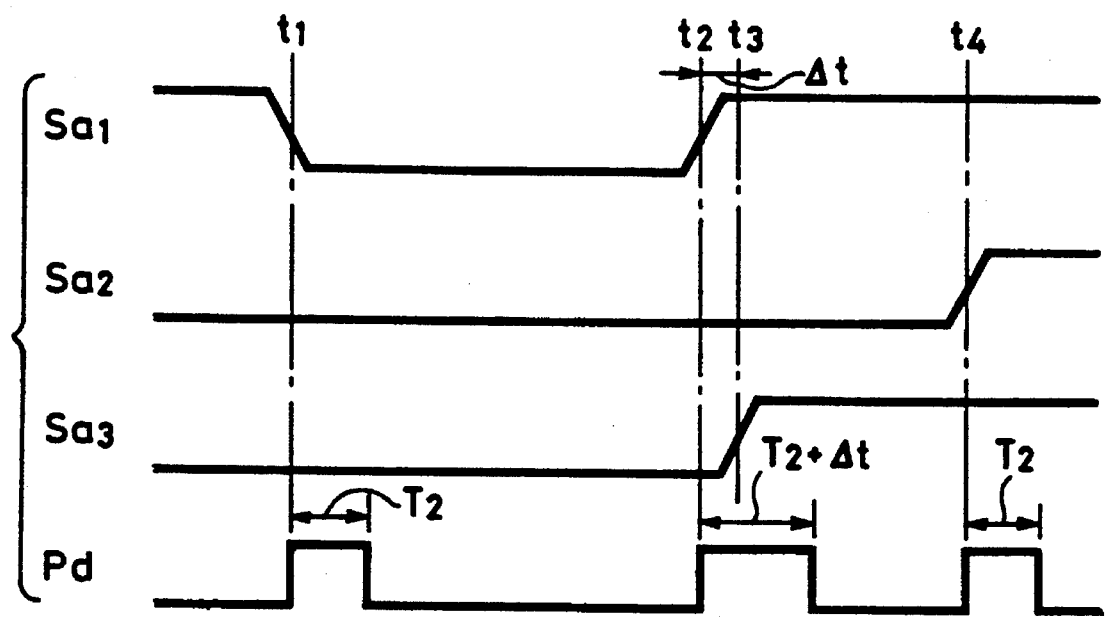
FIG. 9 is a timing chart showing an operation of the pulse sum generating circuit according to the third embodiment of the present invention.

A pulse sum generating circuit D according to a third embodiment of the present invention will be described with reference to FIGS. 8 and 9. In FIGS. 8 and 9, like parts corresponding to those of FIGS. 4 and 6 are marked with the same references.

As shown in FIG. 8, the pulse sum generating circuit D comprises a plurality of pulse generating circuits $A_1, A_2, a_3, \ldots A_n$ and one OR circuit 12. Output terminals of the pulse generating circuits $A_1, A_2, A_3, \ldots A_n$ are connected to the OR circuit 12 in parallel. Corresponding ATD circuits $B_1, B_2, B_3, \ldots B_n$ are connected to the pulse generating circuits $A_1, A_2, A_3, \ldots a_n$.

Operation of the pulse sum generating circuit D will be described with reference to a timing chart of FIG. 9. When only the address signal $S_{a1}$ is changed at timing point $t_1$, the pulse signal $P_1$ having the pulse width $T_2$ is output from the first pulse generating circuit $A_1$ and an output signal Pd having the same waveform as that of the pulse signal $P_1$ is output from the output terminal φd of the OR circuit 12.

When the address signal $S_{a1}$ is changed again at timing point $t_2$ and the address signal $S_{a3}$ is changed after $\Delta t$ ($\Delta t > T_2$), the pulse signal $P_1$ is output again from the first pulse generating circuit $A_1$ and the pulse signal $P_3$ having the pulse width $T_2$ is output from the third pulse generating circuit $A_3$ after $\Delta t$. Accordingly, the output signal Pd which rises at timing point $t_2$ and which has the pulse width $T_2 + \Delta t$ is output from the output terminal φd of the OR circuit 12.

When only the address signal $S_{a1}$ is changed at timing point $t_4$, the pulse signal $P_2$ having the pulse width $T_2$ is output from the second pulse generating circuit $A_2$, and the output signal Pd having the same waveform as that of the pulse signal $P_2$ is output from the output terminal φd of the OR circuit 12.

As described above, the OR circuit 12 can produce the pulse signal Pd having the constant width in response to the change of at least one address signal of a plurality of address signals $S_{a1}, S_{a2}, S_{a3}, \ldots S_{an}$.

Figure 3:
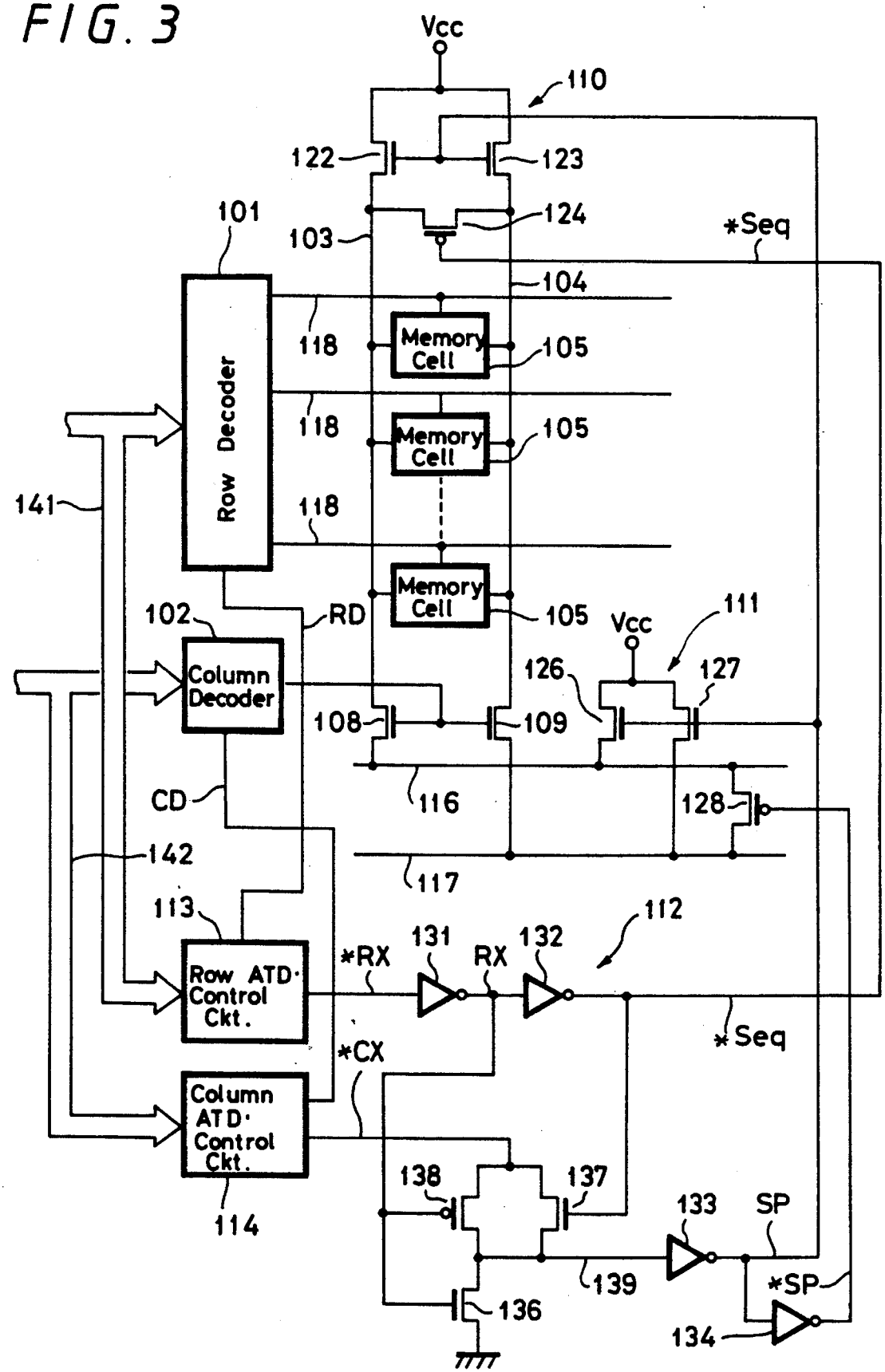
FIG. 3 is a circuit diagram showing bit line and data line equalization circuit of SRAM and peripheral circuits.

If the output signal Pd from the pulse sum generating circuit D is converted into the signal of negative polarity and is utilized as the ATD signal *RX or *CX from the row ATD-control circuit 113 or column ATD-control circuit 114 shown in FIG. 3, then the internal circuit of the SRAM can be initialized sufficiently and the access time of the SRAM can be increased efficiently.

Figure 10:
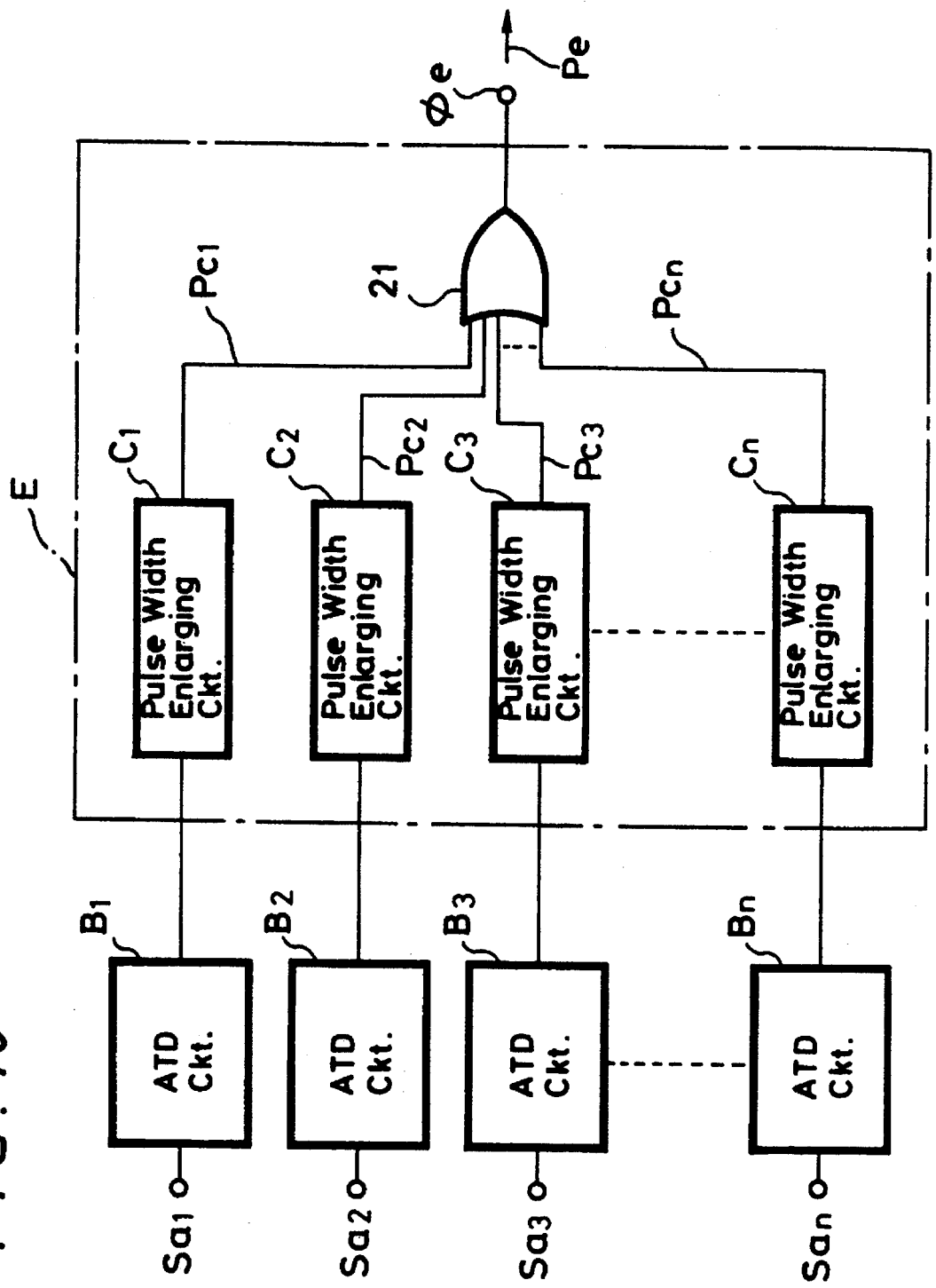
FIG. 10 is a block diagram showing a pulse sum generating circuit according to a fourth embodiment of the present invention.
Figure 11:
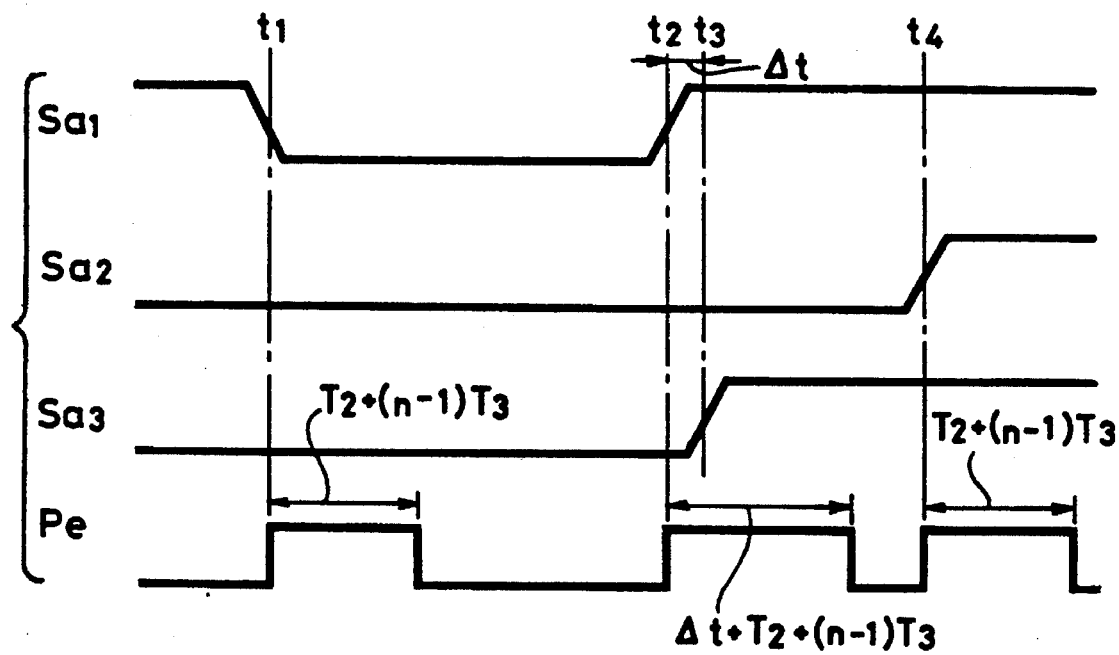
FIG. 11 is a timing chart showing an operation of the pulse sum generating circuit according to the fourth embodiment of the present invention.

A pulse sum generating circuit E according to a fourth embodiment of the present invention will be described with reference to FIGS. 10 and 11. In FIGS. 10 and 11, like parts corresponding to those of FIGS. 6 and 8 are marked with the same references.

As shown in FIG. 10, the pulse sum generating circuit E comprises a plurality of pulse width enlarging circuits $C_1, C_2, C_3, \ldots C_n$ of the second embodiment and one OR circuit 21. Output terminals of the pulse width enlarging circuits $C_1, C_2, C_3, \ldots C_n$ are connected to the OR circuit 21 in parallel. Corresponding ATD circuits $B_1, B_2, B_3, \ldots B_n$ are respectively connected to the pulse width enlarging circuits $C_1, C_2, C_3, \ldots C_n$.

Operation of the pulse sum generating circuit E will be described with reference to a timing chart of FIG. 11. As shown in FIG. 11, when only the address signal $S_{a1}$ is changed at timing point $t_1$, the first pulse width enlarging circuit $C_1$ generates a pulse signal $P_{c1}$ having the pulse width $T_2 + (n-1)T_3$ (see the description of operation of the pulse width enlarging circuit C of the second embodiment shown in FIGS. 6 and 7). An output signal Pe having the same waveform as that of the pulse signal $P_{c1}$ is output from the output terminal φe of the OR circuit 21.

When the address signal $S_{a1}$ is changed again at timing point $t_2$ and the address signal $S_{a3}$ is changed after $\Delta t$ (e.g., $\Delta t < T_2$), the pulse signal $P_{c1}$ is output again from the first pulse width enlarging circuit $C_1$ and the pulse signal $P_{c3}$ having the pulse width $T_2 + (n-1)T_3$ is output from the third pulse width enlarging circuit $C_3$ after $\Delta t$. Accordingly, the output signal Pe which rises at timing point $t_2$ and which has the pulse width $\Delta t + T_2 + (n-1)T_3$ is output from the output terminal φe of the OR circuit 21.

When only the address signal $S_{a2}$ is changed at timing point $t_4$, the pulse signal having the pulse width $T_2 + (n-1)T_3$ is output from the second pulse width enlarging circuit $C_2$ and the output signal Pe having the same waveform as that of the pulse signal $P_{c2}$ is output from the output terminal φe of the OR circuit 21.

Also in the fourth embodiment, similarly to the third embodiment, in response to the change of at least one address signal of a plurality of address signals $S_{a1}$, $S_{a2}$, $S_{a3}$, ... $S_{an}$, the OR circuit 21 can generate the pulse signal (ATD signal) Pe having the arbitrary pulse width sufficient so that the internal circuit of the SRAM, for example, can be initialized.

Figure 12:
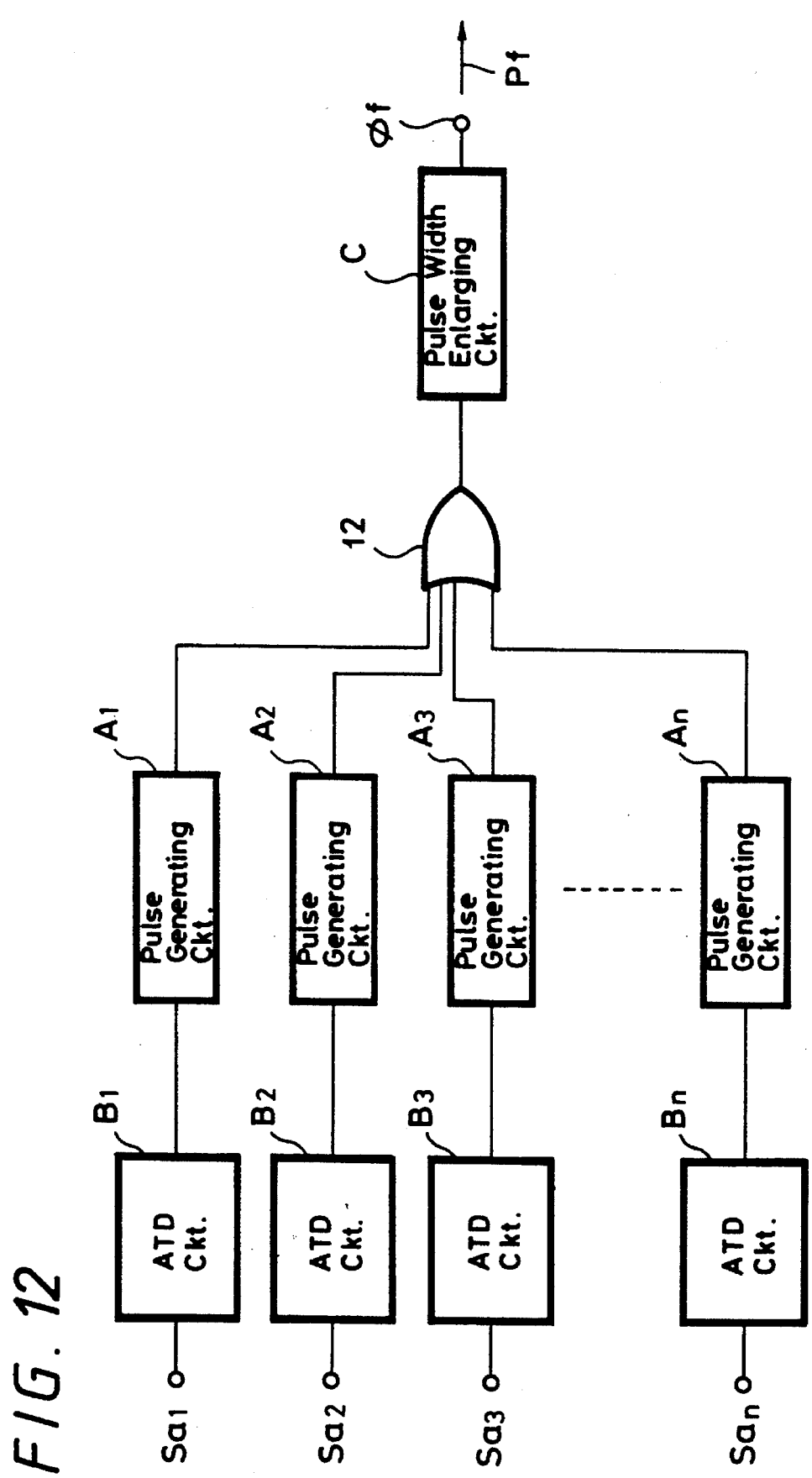
FIG. 12 is a block diagram showing a pulse sum generating circuit according to a fifth embodiment of the present invention.

A pulse sum generating circuit F according to a fifth embodiment of the present invention will be described with reference to FIG. 12. In FIG. 12, like parts corresponding to those of FIGS. 6 and 8 are marked with the same references.

As shown in FIG. 12, the pulse sum generating circuit F comprises a plurality of pulse generating circuits $A_1$, $A_2$, $A_3$, ... $A_n$, one OR circuit 12 and one pulse width enlarging circuit C. Output terminals of the pulse generating circuits $A_1$, $A_2$, $A_3$, ... $A_n$ are connected to the OR circuit 12 and the output terminal of the OR circuit 12 is connected to the pulse width enlarging circuit C. The corresponding ATD circuits $B_1$, $B_2$, $B_3$, ... $B_n$ are connected to the pulse generating circuits $A_1$, $A_2$, $A_3$, ... $A_n$, respectively.

Also in the pulse sum generating circuit F according to the fifth embodiment, the pulse signal Pf similar to that of the fourth embodiment can be obtained from the output terminal φf of the pulse width enlarging circuit C. In response to the change of at least one address signal of a plurality of address signals $S_{a1}$, $S_{a2}$, $S_{a3}$, ... $S_{an}$, the pulse width enlarging circuit C can produce the pulse signal (ATD signal) Pf having the arbitrary pulse width sufficient so that the internal circuit of the SRAM, for example, can be initialized.

Figure 13:
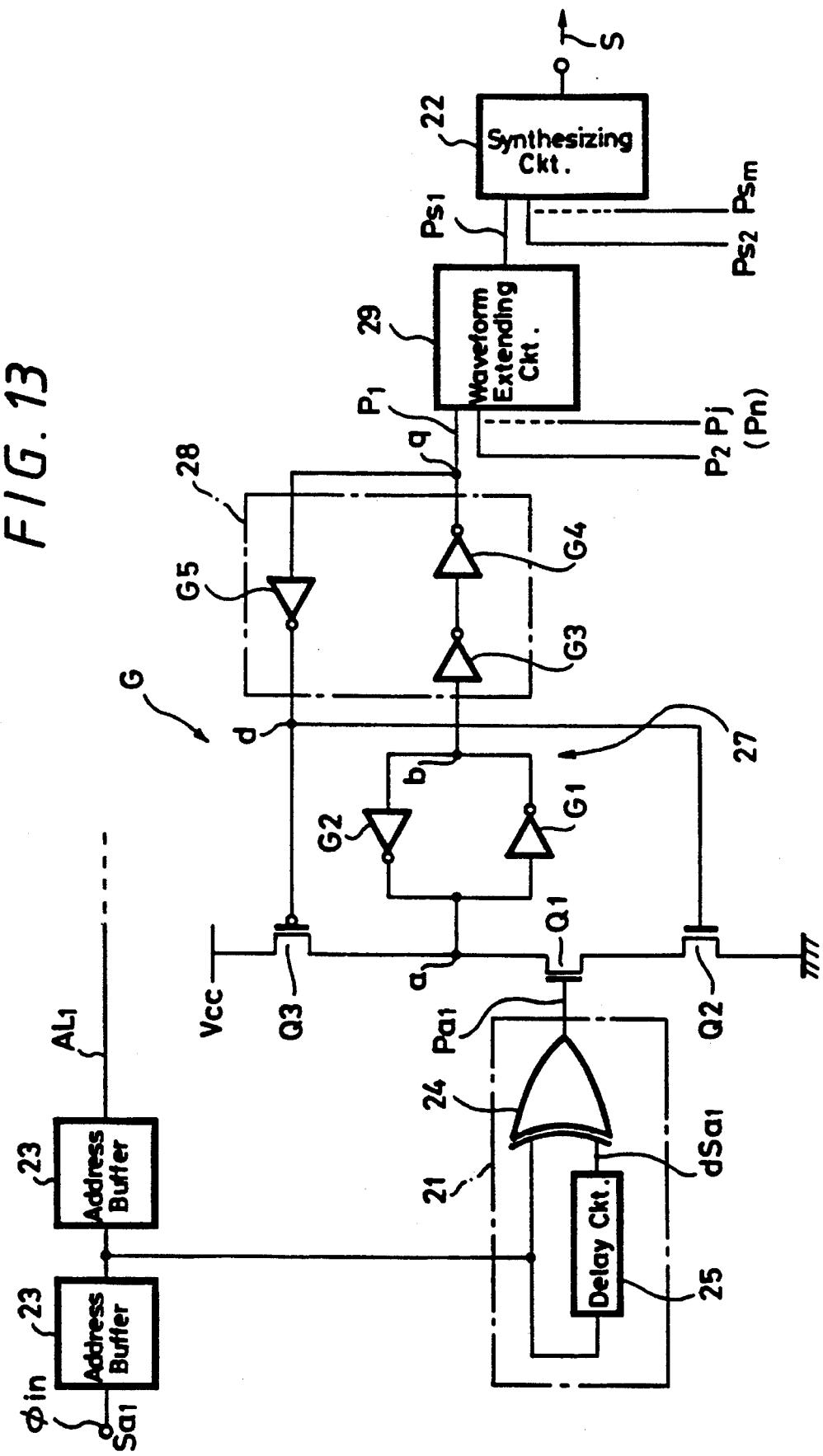
FIG. 13 is a circuit diagram showing a main portion of a semiconductor memory device according to a sixth embodiment of the present invention, in particular, a circuit arrangement that generates an initialization signal for initializing an internal circuit.

A pulse generating circuit G according to a sixth embodiment of the present invention will be described with reference to FIG. 13. FIG. 13 is a block diagram showing a main portion of a semiconductor memory device according to the sixth embodiment, in particular, a circuit arrangement that can generate an initialization signal for initializing the internal circuit of the semiconductor memory device.

A circuit that generates an initialization signal includes address transition detecting circuits (hereinafter simply referred to as ATD circuits) 21 correspondingly connected to a plurality of address lines (in this embodiment, only one address line $AL_1$ is shown for simplicity) and a synthesizing circuit 22 for calculating a sum of ATD signals from the respective ATD circuits 21. In FIG. 13, reference numeral 23 depicts an address buffer.

The ATD circuit 21 comprises a 2-input exclusive-OR circuit 24 and a first delay circuit 25 having a delay time $T_1$. One address signal $S_{a1}$ from the address line $AL_1$ is input to the input terminal of the exclusive-OR circuit 24 and a delay signal dS which results from delaying the address signal $S_{a1}$ by the first delay circuit 25 is input to the other input terminal thereof. An ATD signal (ATD signal is designated by reference symbol $P_{a1}$ because the first address line is described in this embodiment) corresponding to the change of address is output from the output terminal of the ATD circuit 21. The synthesizing circuit 22 is formed of one NAND circuit, for example. The synthesizing circuit 22 generally calculates a sum of ATD signals from the respective ATD circuits 21 and also converts the signal to the signal of negative polarity and outputs the same as the initialization signal *RD or *CD shown in FIG. 3.

In this embodiment, a pulse generating circuit 26 for making the pulse width of the ATD signal constant is interposed between the ATD circuits 21 and the synthesizing circuit 22 (only one pulse generating circuit 26 corresponding to one address line $AL_1$ is shown in FIG. 13). As shown in FIG. 13, the pulse generating circuit 26 comprises a latch circuit 27 formed of two N-channel transistors Q1, Q2, one P-channel transistor Q3 and two inverters G1, G2 and a second delay circuit 28 formed of three inverters G3, G4, G5.

Of the two N-channel transistors Q1 and Q2, a gate of one transistor Q1 is connected to the output of the ATD circuit 21, a source electrode thereof is connected to the input line of the latch circuit 27 through a node a and a drain electrode thereof is connected to a drain electrode of the other N-channel transistor Q2. A source electrode of the transistor Q2 is grounded and a gate thereof is connected to the output of the second delay circuit 28 through a node d.

A drain electrode of the P-channel transistor Q3 is connected to the positive voltage source terminal Vcc, a source electrode thereof is connected to the input line of the latch circuit 27 through a node a and a gate thereof is connected to the output of the second delay circuit 28.

In this pulse generating circuit 26, the latch circuit 27 and the second delay circuit 28 are connected via a node b and the output terminal thereof is led out from the intermediate portion of the second delay circuit 28, i.e., the output of the second inverter G4 of the three inverters G3, G4, G5 constructing the second delay circuit 28 via a node c.

Figure 14:
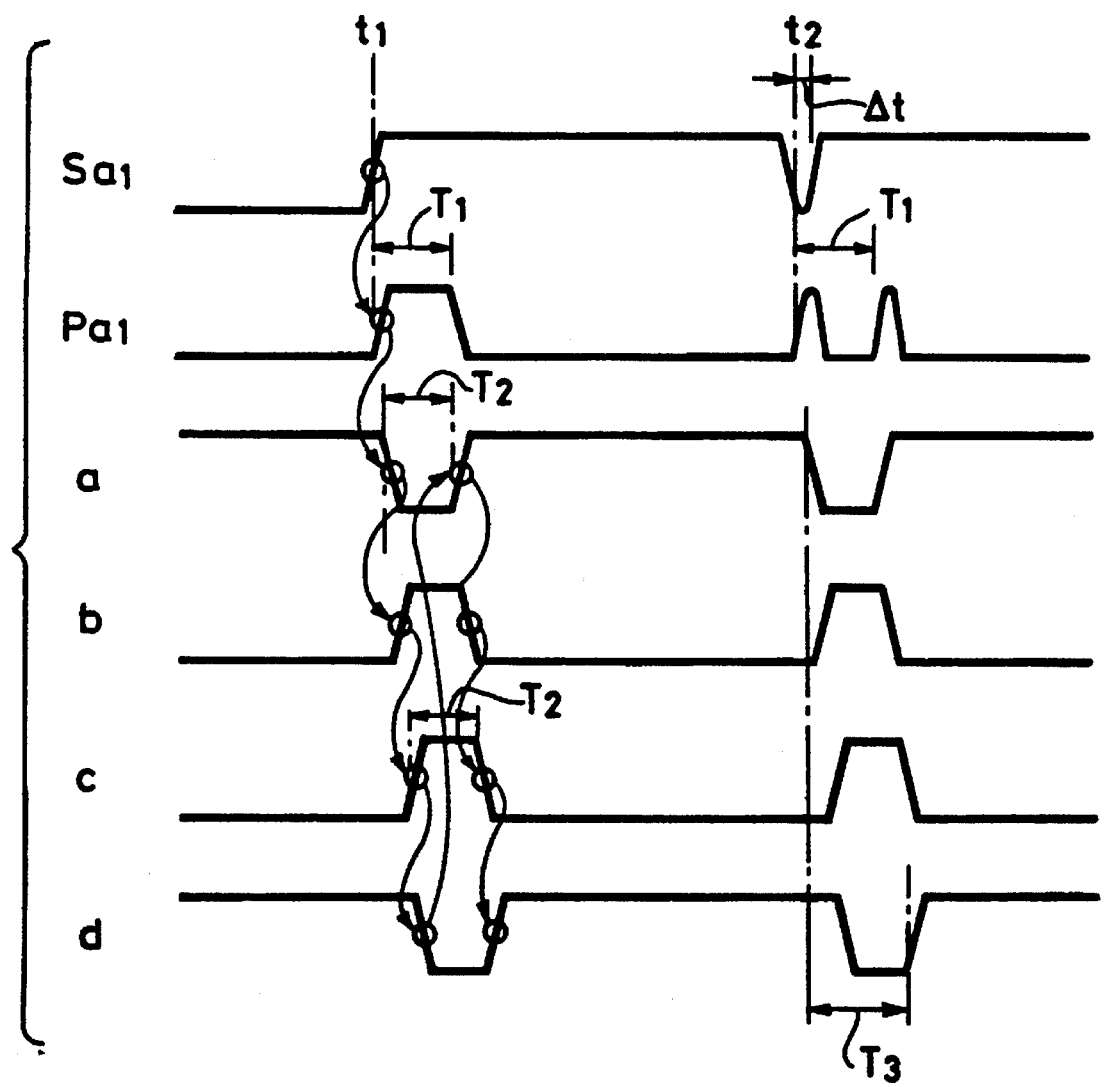
FIG. 14 is a timing chart showing an operation of a circuit arrangement that generates an initialization signal for initializing an internal circuit of the semiconductor memory device according to the sixth embodiment of the present invention.

Operation of the pulse generating circuit 26 will be described with reference to a timing chart of FIG. 14.

Under the condition that the address signal $S_{a1}$ supplied to the input terminal φin of the address line $AL_1$ has no change, i.e., under the condition that there is no address change, the nodes a and d are both at high level so that the transistors Q3 and Q2 are turned off and on, respectively. The levels of the nodes a and d are stabilized by the latch circuit 27.

When the address changes occurs at timing point $t_1$ and the ATD signal $P_{a1}$ from the ATD circuit 21 is input to the gate of the transistor Q1, the transistor Q1 is turned on so that the node a is inverted to low level. This change of level is transmitted through the inverter G1 of the latch circuit 27 and the three inverters G3, G4, G5 of the second delay circuit 28 to the node d so that the node d is inverted to low level.

When the node d goes to low level, the transistor Q3 is turned on and the transistor Q2 is turned off so that the node a is raised to the high level side. When the node a goes to high level, this change of level is transmitted through the inverter G1 of the latch circuit 27 and the three inverters G3, G4, G5 o the second delay circuit 28 to the node d so that the transistor Q3 is turned off and a series of operation is ended. During this operation, one pulse signal $P_1$ is generated from the node c and then output from the output terminal. This pulse signal $P_1$ has a pulse width that is determined by a time $t_2$ during which the pulse signal $P_1$ is propagated through the nodes b, c and d to the node a. Such pulse width becomes a constant pulse width.

When the pulse-shaped signal having a pulse width Δt shorter than the delay time $T_1$ of the first delay circuit 22 is supplied to the ATD circuit 21 at timing point $t_2$, the ATD circuit 21 continuously outputs two pulse signals having the pulse width Δt at time interval of the delay time $T_1$. At the same time, the two continuous pulses are input to the gate of the transistor Q1.

At that time, although the level of the node c is inverted to high by the first pulse signal, it does not respond to the second pulse signal. The reason for this is that, after the change of the node a to the low level by the first pulse signal is transmitted through the nodes b, c and d and the node a goes again to high level, this change of level is again transmitted through the nodes b and c to the node d. Therefore, even though the potential at the gate of the transistor Q1 is changed within a time TB ($>T_1$) during which the transistor Q2 is turned on, such change is not reflected on the level of the node c. Then, the transistor Q2 is turned on and a series of operation is ended. During this operation, one pulse signal $P_1$ is generated from the node c and then output from the output terminal. This pulse signal $P_1$ has a pulse width that is determined by the time $T_2$ during which the signal at the node a is propagated to the node a again through the nodes b, c and d. Such pulse width becomes a constant pulse width.

Pulse signals P ($P_1$, $P_2$, ... $P_n$) from the pulse generating circuits 26 provided in association with a plurality of address lines are supplied to the synthesizing circuit 22 of the succeeding stage and an initialization signal S is output from the synthesizing circuit 22.

When the pulse signals ($P_1$, $P_2$, ... $P_n$) from the respective pulse generating circuits 26 do not have pulse widths sufficient so that the internal circuit of the semiconductor memory device can be initialized, a waveform extending circuit 29 may be connected to the succeeding stage of the pulse generating circuit 26 as shown in FIG. 13. In this case, since the pulse width of the pulse signal $P_1$ from the pulse generating circuit 26 is guaranteed, the waveform extending circuit 29 can be formed of a simple circuit.

Figure 15:
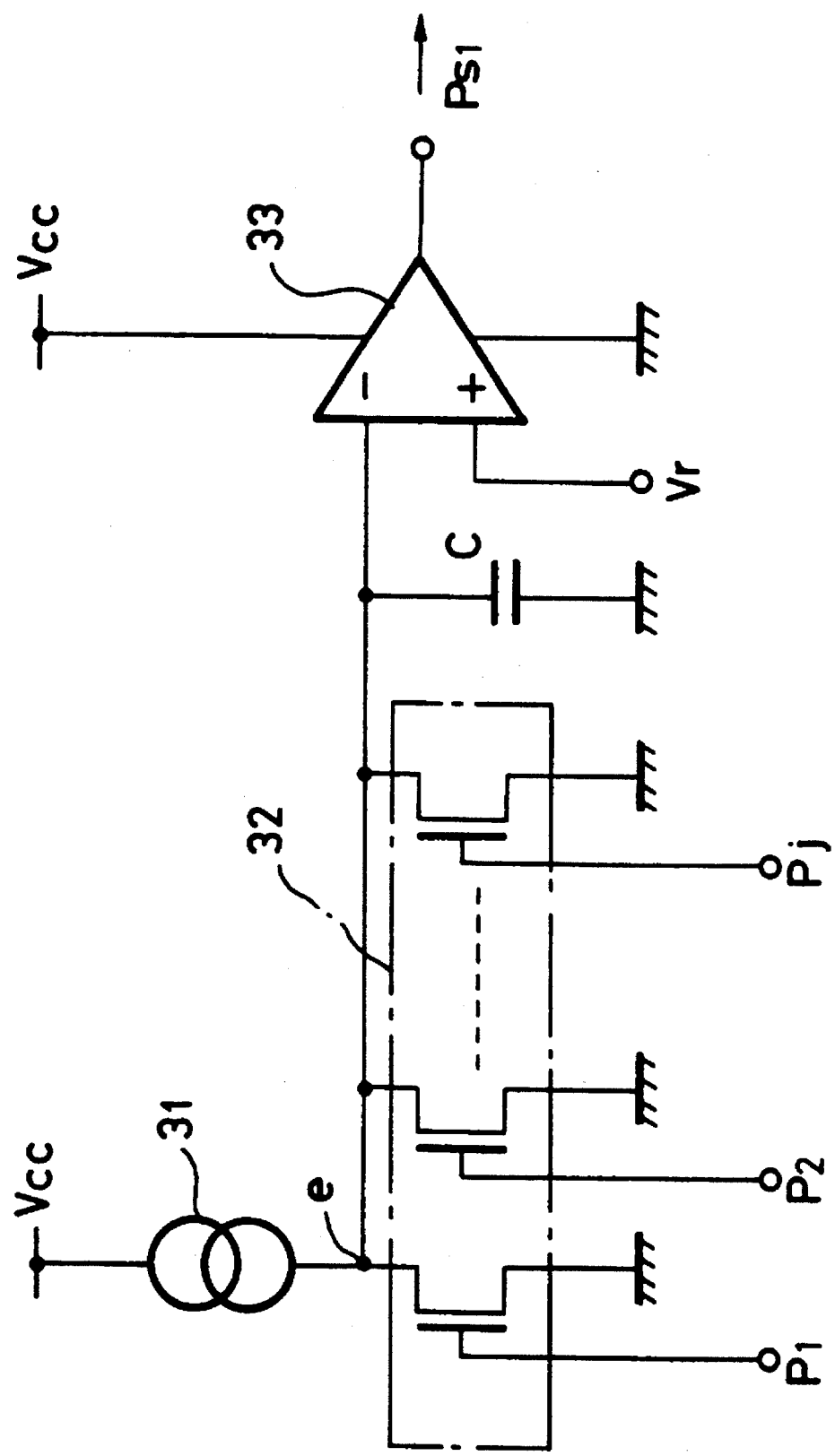
FIG. 15 is a block diagram showing a waveform extending circuit according to the sixth embodiment of the present invention.

As shown in FIG. 15, for example, the waveform extending circuit 29 comprises a constant current source 31 formed of P-channel transistors of multiple stage connected in series, a switching unit 32 formed of a number of N-channel transistors connected in parallel and a capacitor C produced by the layout of wiring. The switching unit 32 and the constant current source 31 are connected to the node e and an output from the node e is supplied to a negative terminal of a comparator 33 of the rear stage. A reference potential Vr is applied to a positive terminal of the comparator 33.

In this embodiment, a plurality of address lines are separated into blocks of every several blocks and one waveform extending circuit 29 is disposed at every block. The pulse signals $P_1$, $P_2$, ... $P_j$ from the pulse generating circuits 26 in the corresponding blocks are input to the respective waveform extending circuits 29. Accordingly, to the synthesizing circuit 22 of the succeeding stage, there are supplied pulse signals $P_{a1}$, $P_{s2}$, ... $P_{sm}$ from the respective waveform extending circuits 29.

Figure 16:
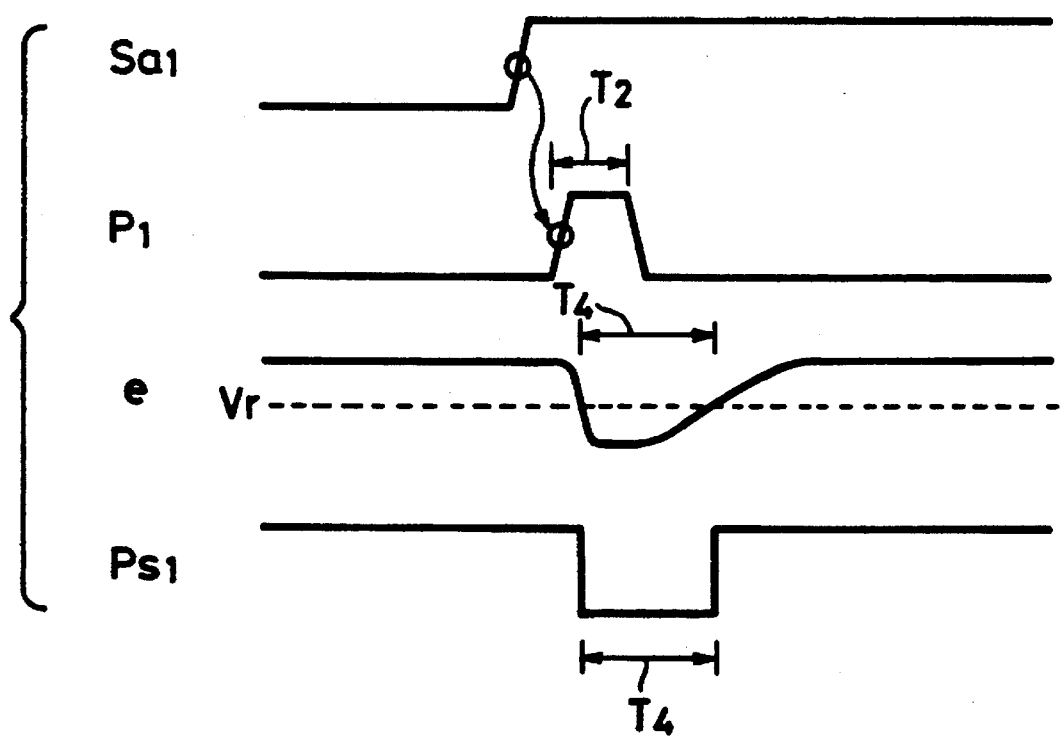
FIG. 16 is a timing chart showing an operation of the waveform extending circuit according to the sixth embodiment of the present invention.

Operation of the waveform extending circuit 29 will be described with reference to a timing chart of FIG. 16.

Under the condition that there is no address change, the output from the node e is at high level so that the output $P_{s1}$ of the comparator 33 goes to high level. When the address signal $S_{a1}$ supplied to the address line $AL_1$, for example, is changed, as described above, one pulse signal P having the constant pulse width T2 is output from the pulse generating circuit 26. As a consequence, the node e goes to low level on the basis of the leading edge o the pulse signal $P_1$. When the level of the node e is lowered under the reference potential VR, the level of the comparator 33 is inverted to low. When the level of the pulse signal $P_1$ lowered again after the time $T_2$, the corresponding transistor in the switching unit 22 is turned off to raise the level of the node e to the high level side.

At that time. by a time constant determined by the inside resistance of the P-channel transistor constructing the constant current source and the capacitor C, the leading edge of the node e is blunted, thus requiring a lot of time until the level of the node e becomes higher than the reference potential Vr. Having defined this time as time $T_4$, the time $T_4$ is set to be longer than the width $T_2$ of the pulse signal $P_1$ from the pulse generating circuit 26 by properly selecting the number of stages of the P-channel transistor.

As described above, when the level of the node e becomes higher than the reference potential Vr, the output $P_{s1}$ of the comparator 33 is inverted to high level and a series of operation is ended. During this operation, the comparator 33 outputs one pulse signal $P_{s1}$ of negative polarity having a pulse width $T_4$. The waveform extending circuit 29 is served also as a circuit that calculates a sum of the pulse signals $P_1$, $P_2$, ... $P_n$ from the respective pulse generating circuits 26. After one address is changed, when such address is changed within the time $T_4$ or when other address is changed, the width of the pulse signal $P_{s1}$ output from the comparator 33 becomes a width which results from adding a time from the first address change to the next address change to the time $T_4$.

The synthesizing circuit 22 of the succeeding stage receives the pulse signals $P_1$, $P_2$, ... $P_n$ from the pulse generating circuits 26 corresponding to a plurality of address lines or the pulse signals $P_{s1}$, $P_{s2}$, ... $P_{sn}$ from the waveform extending circuits 29. Then, the synthesizing circuit 22 calculates a sum of these pulse signals and outputs the same as the initialization signal S for the internal circuit of the semiconductor memory device. In this case, assuming that the initialization signal S is matched with the signal *RX or *CX shown in FIG. 3, when the pulse signals P ($P_1$, $P_2$ ... ) from the pulse generating circuits 26 or pulse signals Ps ($P_{s1}$, $P_{s2}$ ... ) from the waveform extending circuits 29 are negative in polarity, the synthesizing circuit 22 can be formed of a multi-input NAND circuit and one inverter. Further, when the pulse signals P ($P_1$, $P_2$ ... ) from the pulse generating circuit 26 or the pulse signals Ps ($P_{s1}$, $P_2$ ... ) from the waveform extending circuit 29 are negative in polarity, the synthesizing circuit 22 may be formed of a multi-input NOR circuit.

Furthermore, the pulse signals $P_1$, $P_2$, ... $P_n$ from the pulse generating circuits 26 concerning all address lines may be input to the waveform extending circuit 29. In this case, there may be provided one synthesizing circuit 22.

As described above, according to this embodiment, since the pulse generating circuit 26 for making the pulse width of the ATD signal $P_{a1}$ constant is connected between the ATD circuit 21 and the synthesizing circuit 22, it is possible to make the pulse width of the ATD signal $P_{a1}$ which becomes a reference of the initialization signal S that is required to initialize (reset and equalize) the internal circuit of the semiconductor memory device.

As a result, there can be obtained the initialization signal S having the width sufficient so that the internal circuit of the semiconductor memory device can be initialized. Therefore, even when the pulse signal having the pulse width insufficient so that the internal circuit of the semiconductor memory device can be initialized is input as the address signal, it is possible to obtain the initialization signal S having the necessary pulse width.

Figure 17A:
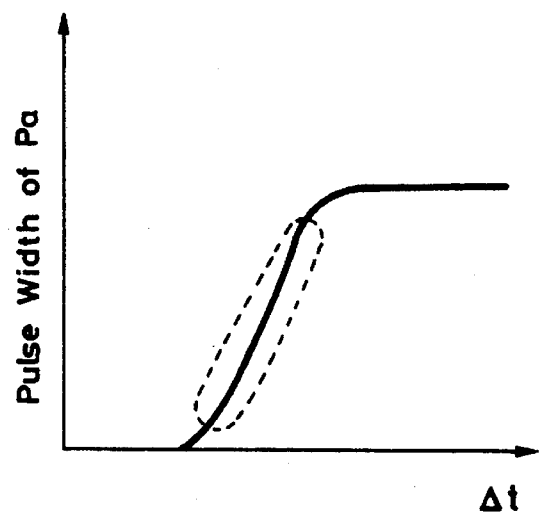
FIG. 17A is a characteristic graph showing the change of an ATD signal width relative to the address noise width according to the prior art.
Figure 17B:
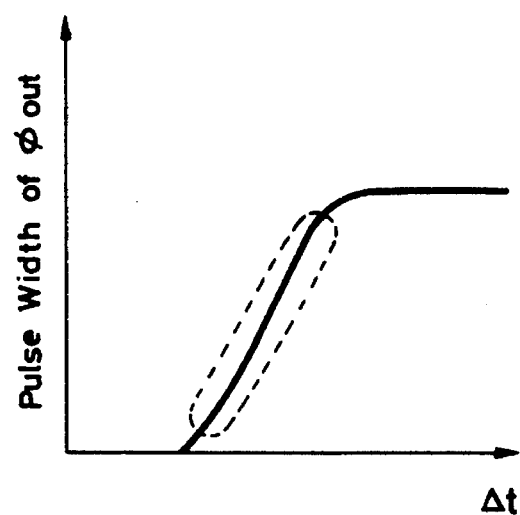
FIG. 17B is a characteristic graph showing the change of the initialization signal width relative to the address noise width according to the prior art.

In the conventional ATD circuit 21, as shown in a characteristic graph of FIG. 17A. since the pulse width of the ATD signal Pa is continuously changed relative to the change of the width of address noise, the initialization signal S also is changed continuously similarly to the ATD signal Pa (see FIG. 17B). In particular, when an address noise (e.g., fine glitch or hazard having a width of about 5 nsec) in a broken-line area is input, the ATD Pa signal having the width necessary for the initialization of the internal circuit and the initialization signal S cannot be obtained.

Figure 18A:
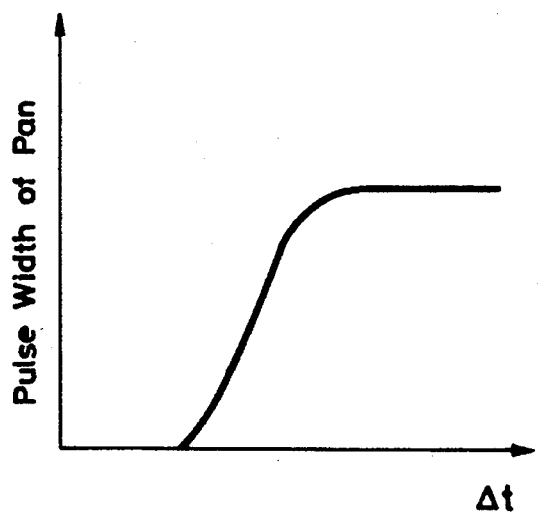
FIG. 18A is a characteristic graph showing the change of the ATD signal width relative to the address noise according to the sixth embodiment of the present invention.
Figure 18B:
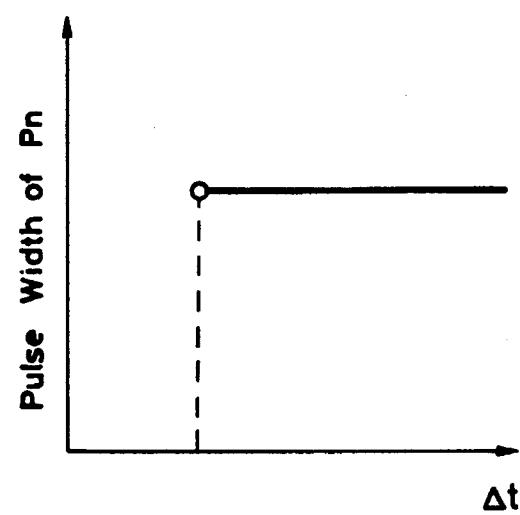
FIG. 18B is a characteristic graph showing the change of the initialization signal width relative to the address noise according to the sixth embodiment of the present invention.

On the other hand, according to this embodiment, although the pulse width of the ATD signal Pa is continuously changed relative to the change of the width of the address noise as shown in a characteristic graph of FIG. 18A, the pulse width of the ATD signal Pa is corrected to be constant by the pulse generating circuit 26 of the succeeding stage. Therefore, as shown in a characteristic graph of FIG. 18B, the pulse width of the initialization signal S is changed in a discrete fashion so that, even when the address noise having the width of about 5 nsec is input, the pulse width of the initialization signal S becomes constant and there can be obtained the initialization signal S having the pulse width sufficient so that the internal circuit of the semiconductor memory device can be initialized.

Accordingly, when the address signal is changed at a short cycle or when a noise is input to the address input terminal, the internal circuit can be initialized with sufficient time. Thus, a fluctuation of access time and a malfunction due to the waveform of the address signal can be removed. Also, the semiconductor memory device can be operated at high speed. Furthermore, when a PWL timer is utilized and activated by the initialization signal, a failure in the read-out operation due to the insufficient operation period of the PWL timer can be prevented.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A pulse sum generating circuit comprising at least one pulse width enlarging circuit whose input is coupled to a trigger pulse signal and means having a plurality of input terminals and calculating a sum of input signals, wherein an output signal of said pulse width enlarging circuit is coupled to input terminals of said means that calculates a sum of input signals.

2. A semiconductor memory device comprising address transition detecting circuits correspondingly connected to a plurality of address lines, and a synthesizing circuit connected to a succeeding stage of said address transition detecting circuits and calculating a sum of address transition detection signals from said respective address transition detecting circuits to thereby reset or equalize an internal circuit on the basis of an output signal from said synthesizing circuit, wherein a pulse generating circuit for making a pulse width of said address transition detection signal constant is connected between said address transition detecting circuits and said synthesizing circuit.

3. The semiconductor memory device according to claim 2, wherein said pulse generating circuit includes a latch circuit for holding an input of said address transition detection signal and a delay circuit for delaying a signal from said latch circuit and resetting said latch circuit on the basis of the delayed signal.

4. A pulse width extending circuit comprising means having a plurality of input terminals and calculating a sum of input signals, a plurality of constant pulse width generating circuits connected to said plurality of input terminals and a voltage comparing amplifier circuit having one input terminal to which an output signal of said means for calculating a sum of input signals and the other input terminal thereof being connected to a reference potential.

5. A constant pulse width generating circuit comprising a flip-flop circuit and a delay circuit, said flip-flop circuit having a first input terminal to which a control signal for setting an output signal to a first logic value is input, a second input terminal to which a control signal for setting an output signal to a second logic value is input and an output terminal, wherein a trigger pulse signal is input to said first input terminal, a signal which results from delaying an output signal of said flip-flop circuit by said delay circuit is input to said second input terminal and the output signal of said flip-flop circuit is output to said output terminal, and means having a plurality of input terminals and calculating a sum of input signals, wherein the output signal of said constant pulse width generating circuit is coupled to input terminals of said means that calculates a sum of input signals.

6. The pulse sum generating circuit according to claim 5 or 1, wherein said trigger pulse signal is an address transition detection signal that is generated in response to the change of an address signal.

\* \* \* \* \*